United States Patent [19]

Inoue et al.

[11] Patent Number: 5,148,260
[45] Date of Patent: Sep. 15, 1992

[54] SEMICONDUCTOR DEVICE HAVING AN IMPROVED AIR-BRIDGE LEAD STRUCTURE

[75] Inventors: Tomotoshi Inoue, Kanagawa; Toshiyuki Terada, Tokyo; Kenichi Tomita, Kanagawa, all of Japan

[73] Assignee: Kabushiki Kaisha Toshiba, Kawasaki, Japan

[21] Appl. No.: 578,436

[22] Filed: Sep. 7, 1990

[30] Foreign Application Priority Data

Sep. 7, 1989 [JP] Japan .................................. 1-230485

[51] Int. Cl.⁵ ........................ H01L 23/50; H01L 23/54
[52] U.S. Cl. .......................................... 357/67; 357/68; 357/71
[58] Field of Search ................ 357/69, 68, 71, 67

[56] References Cited

U.S. PATENT DOCUMENTS

| | | | |
|---|---|---|---|
| 3,647,585 | 3/1972 | Fritzinger et al. | 357/71 |
| 3,890,636 | 6/1975 | Harada et al. | 357/69 |
| 3,925,880 | 12/1975 | Rosvold | 357/69 |
| 4,807,002 | 2/1989 | Donzelli | 357/68 |
| 4,916,520 | 4/1990 | Kurashima | 357/71 |
| 4,933,743 | 6/1990 | Thomas et al. | 357/71 |

*Primary Examiner*—Rolf Hille
*Assistant Examiner*—S. V. Clark
*Attorney, Agent, or Firm*—Oblon, Spivak, McClelland, Maier & Neustadt

[57] ABSTRACT

A semiconductor device having an improved air-bridge lead structure is provided. The improved air-bridge lead structure has a higher mechanical strength and a lower electric resistance with a smaller electric capacitance.

10 Claims, 5 Drawing Sheets 5,148,260

SEMICONDUCTOR DEVICE HAVING AN IMPROVED AIR-BRIDGE LEAD STRUCTURE

BACKGROUND OF THE INVENTION

1. Field of the Invention

This invention relates to a semiconductor device having an air-bridge lead structure, and more particularly to a semiconductor device having an improved air-bridge lead structure which has a higher mechanical strength and a lower electric resistance with smaller electric capacitance than conventional air-bridge lead structures.

2. Description of the Prior Art

In a high-speed performance IC having a GaAs substrate and Schottky gate-type FETs formed thereon, the signal transfer delay at inner lead portions must be greatly reduced. To achieve this, the capacitance between the leads has been reduced by interposing therebetween substances having lower dielectric constants. More specifically, a so-called air-bridge lead structure has been developed in which a vacuum is formed between the leads or appropriate gases are contained between the leads whereby the leads are electrically insulated.

FIG. 3A is a cross-sectional view illustrating a conventional air-bridge lead structure. In FIG. 3A, first through fourth electrodes $2a$ through $2d$ are formed on the surface of a semiconductor substrate 1. An air-bridge lead 3 is formed crossing over the second and third electrodes $2b$ and $2c$ so as to connect the first electrode $2a$ to the fourth electrode $2d$. Assume that the distance between the first and fourth electrodes $2a$ and $2d$ is relatively large. In this case, the air-bridge lead 3 might fall down by its own weight or by an external impact, as indicated by the dotted line shown in FIG. 3A. In general, the air-bridge lead 23 is made of materials such as Al, Au, Cu and the like which have a lower specific resistance.

However, these metals have lower rigidity, and thus the falling down of the air-bridge lead 23 inevitably occurs. If the air-bridge lead 23 is made of one of the metals such as W, Mo and the like, having a higher rigidity, such mechanical failures could be effectively suppressed. However, these metals have specific electric resistances much higher than those of metals such as Al, Au, Cu and the like. Thus, metals of W, Mo and the like are not suitable for practical applications. Assume that an air-bridge lead made of W is designed to have the same electric resistance per unit length as that of an air-bridge lead made of Au. In this case, the cross-sectional area of the former must be much greater than that of the latter. This inevitably increases the surface area of the air-bridge lead made of W. Thus, the electric capacitance around the air-bridge lead made of W inevitably increases. As a result, the signal transfer delay of the lead portions, which is determined depending on the product of RC (R=resistance, and C=capacitance), also increases.

FIG. 3B shows another conventional technique to solve the above-described disadvantage. Specifically, a redundant fifth electrode $2e$ which is electrically insignificant is formed on the surface of the substrate 1 at substantially the middle between the first and fourth electrodes $2a$ and $2d$. A support 4 is connected between the air-bridge lead 3 and the fifth electrode $2e$ so as to prevent the falling down of the air-bridge lead 3. However, the air-bridge lead structure shown in FIG. 3B still has the following disadvantages. First, assume that metals such as Al, Au, Cu and the like having lower specific resistance and lower rigidity are employed to form the air-bridge lead. In this case, plural redundant electrodes and supports similar to the fifth electrode $2e$ and the support 4 must be provided at intervals of about 100 $\mu$m. This degrades the integration density of ICs and prevents the miniaturization of semiconductor devices. Second, when heat is carried to the air-bridge lead made of one of metals such as Al, Au, Cu and the like, the lead is softend. Further, if the lead is left at a temperature of about 200° C. or more for a long time, the lead will fall down.

As described above, in the conventional air-bridge lead structure, metals such as Al, Au, Cu and the like having lower specific electric resistance and lower rigidity have been employed to form the air-bridge lead. Thus, the falling down of the air-bridge lead inevitably arises when the internal temperature of the IC rises. On the other hand, metals such as W, Mo and the like having higher rigidity (higher Young's modulus) could be employed to enhance the mechanical strength of the air-bridge lead structure. However, these metals are not suitable for practical application because of their higher specific electric resistances. Further, redundant electrodes which are electrically insignificant have been formed on the substrate in order to support the air-bridge lead. However, these supports and redundant electrodes must be formed at intervals of about 100 $\mu$m to achieve the desirable mechanical strength of the air-bridge lead structure. Such redundant electrodes are disadvantageous to the miniaturization of ICs.

SUMMARY OF THE INVENTION

Accordingly, one object of the present invention is to provide a semiconductor device having an improved air-bridge lead structure which has achieved higher mechanical strength and lower electric resistance with smaller electric capacitance.

Another object of the present invention is to provide a method of manufacturing the above-described semiconductor device.

Briefly, in accordance with one aspect of the present invention, there is provided a semiconductor device having an air-bridge lead structure which comprises a semiconductor substrate having a surface, a plurality of electrodes formed on the surface of the semiconductor substrate, and an air-bridge lead electrically connected between the plural electrodes, the air-bridge lead having at least a first metal layer and a second metal layer, the first metal layer having a Young's modulus higher than that of the second metal layer, and the second metal layer having a specific electric resistance lower than that of the first metal layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
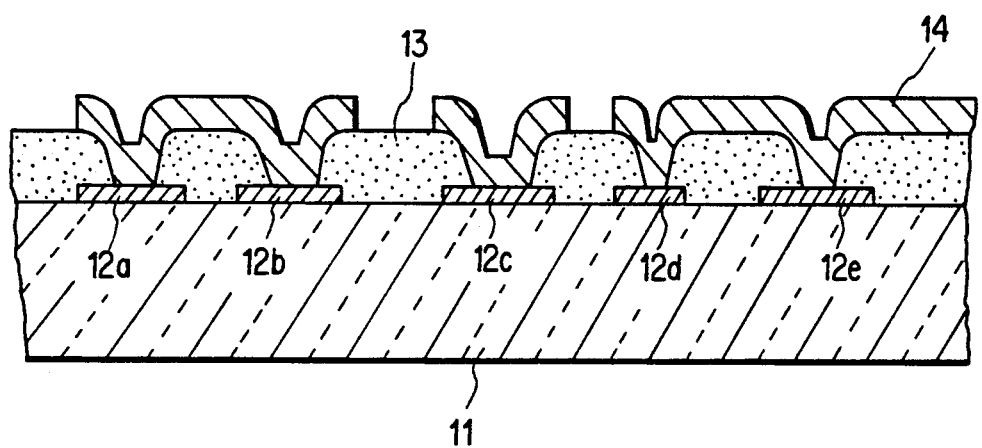
FIGS. 1A through 1F are cross-sectional views illustrating the processes of manufacturing a first embodiment according to the present invention.
Figure 1B:
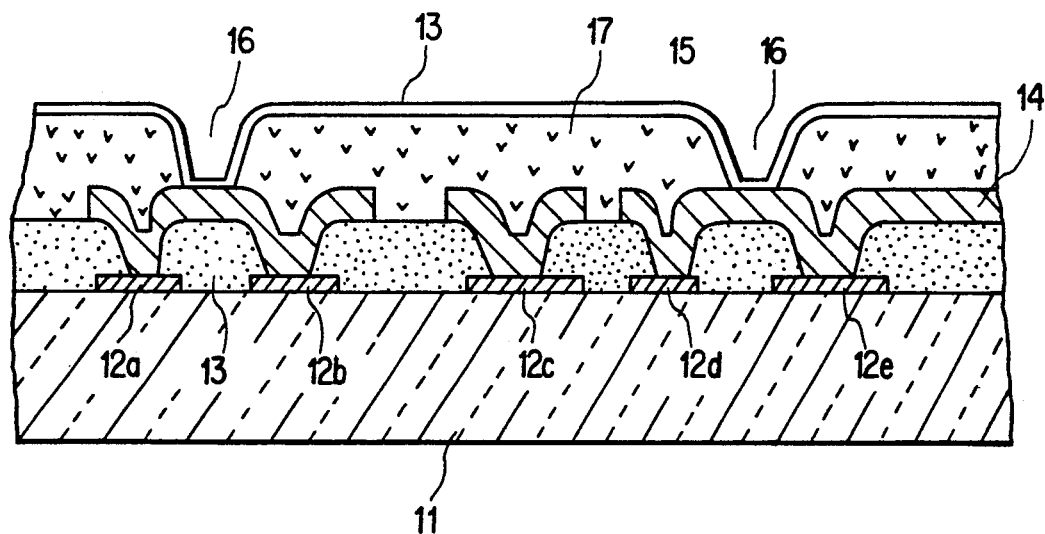

An air-bridge lead structure according to the present invention has at least two different kinds of metal layers. The metal layers include a first metal layer and a second metal layer. The first metal layer is made of one of metals being selected from W, Mo, Ru and Rh. The second metal layer is made of one of metals being selected from Au, Al and Cu. Thus, the first metal layer has a Young's modulus higher than that of the second metal. Further, the second metal layer has a specific electric resistance lower than that of the first metal layer. Moreover, the first and second metal layers are less reactive to each other. As a result, the air-bridge lead structure according to the present invention can achieve both the lower electric resistance and the higher mechanical strength to support the same. The multi-layered metal layer of the air-bridge lead structure of this invention significantly differs from the conventional multi-layered metal film formed on an interlayer insulating film in the following respects. Specifically, the conventional multi-layered metal film is formed in order to enhance the strength with respect to the flow of electrons. In other words, the purpose of this combination of metals is to enhance the reliability in terms of physical chemistry, i.e., to enhance the electromigration-resist and stressmigration of the multi-layered metal film. In marked contrast to this, the multi-layered metal layer of the air-bridge lead structure of this invention is intended to enhance the mechanical strength of its three-dimensional structure. Further, the multi-layered metal layer of this invention can be easily formed by use of a conventional plating technique.

Referring now to the drawings, wherein like reference numerals designate identical or corresponding parts throughout the several views, and more particularly to FIG. 1 thereof, a first embodiment of this invention will be described.

FIGS. 1A through 1F show the processes of manufacturing a first embodiment according to the present invention. In FIG. 1A, first through fifth electrodes 12a through 12e are formed on the surface of a semiconductor substrate 11. An insulating film 13 made of SiO$_2$, for example, having plural openings at prescribed positions is formed on the surface of the substrate 11. Thereafter, a lead layer 14 is formed on the insulating film 13 and in its openings so as to make connection between the electrodes 12a through 12e in the prescribed manner.

An air-bridge lead structure of this invention is formed in the following manner. Specifically, as seen from FIG. 1B, a photo-resist 15 is coated on the entire surface of the substrate 11. A plurality of openings 16 are then made in the photo-resist 15 at prescribed positions such that the partial portions of the lead layer 14 are exposed. This is performed by use of a photolithography technique. Further, the sidewalls of the openings 16 in the photo-resist 15 are shaped into a taper form by use of a heat treatment technique (at about 150° C.). Thereafter, a lower layer (a first layer) 17 made of W of about 1000 Å thick is formed on the entire surface of the substrate 11. This is performed by use of a vacuum evaporation technique. The W has a specific electric resistance higher than that of Au which is used to form an upper layer (a second layer) in the subsequent process. However, the W has a Young's modulus higher than the Au, and W is less reactive to Au. Further, W may be replaced with other metals such as Mo, Rh or Ru or with metal compounds such as WAl, WSi$_2$ or MoSi$_2$.

Figure 1C:
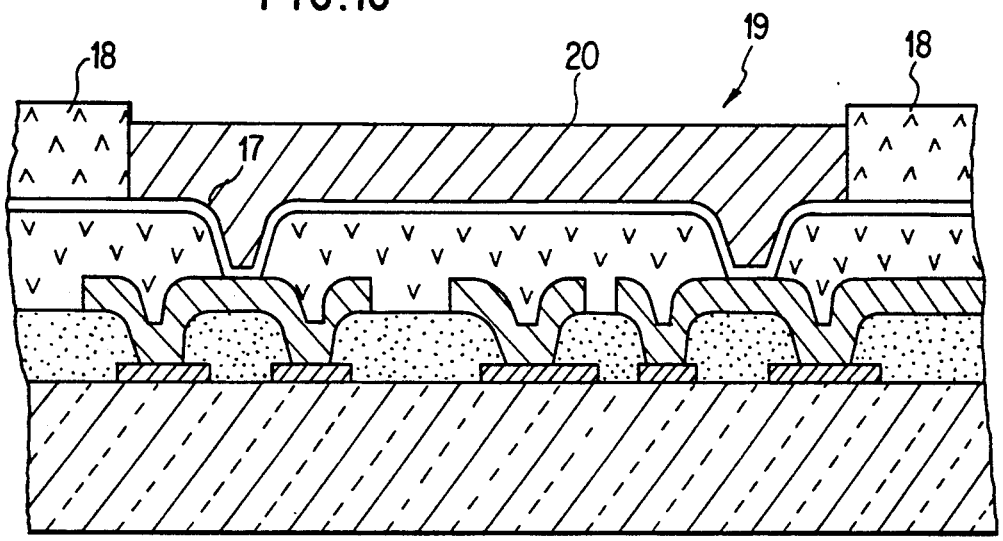
Figure 1D:
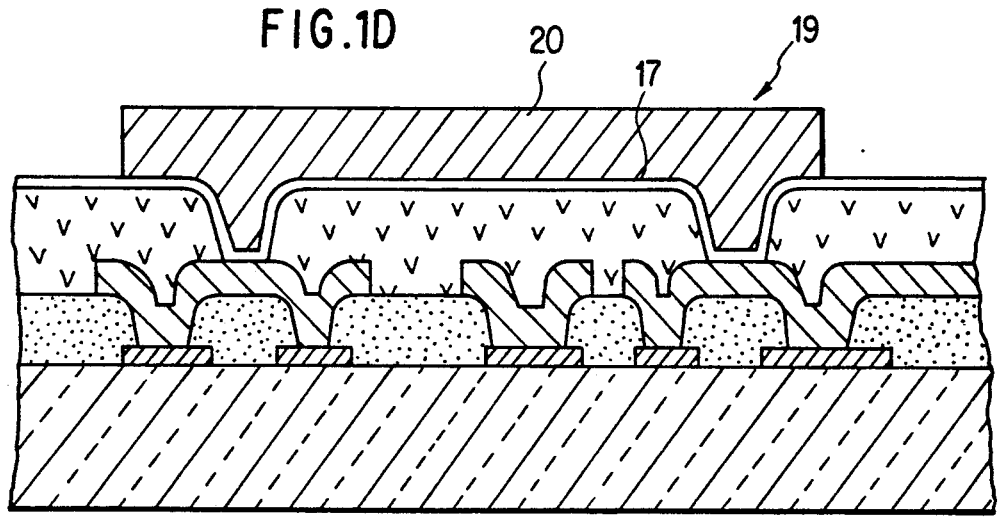
Figure 1E:
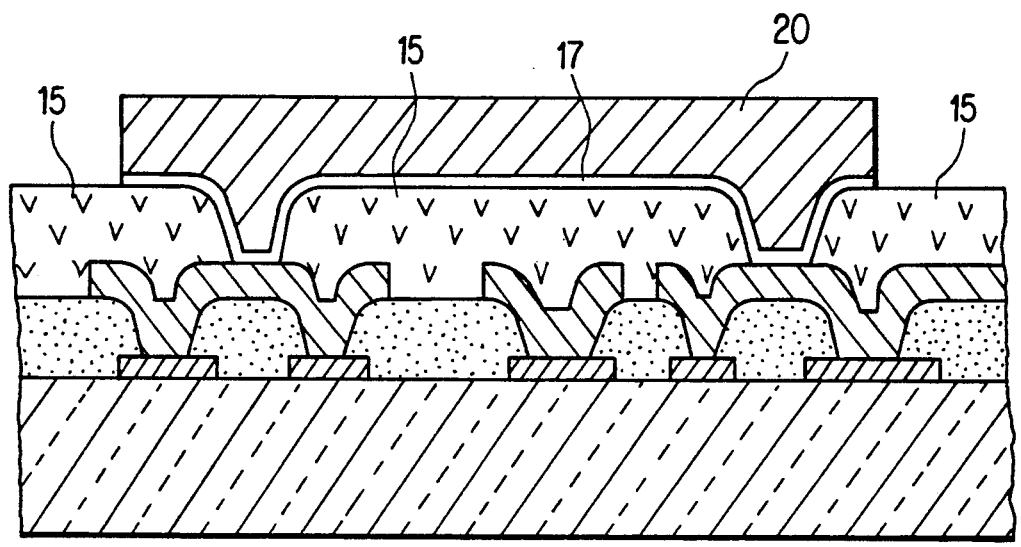
Figure 1F:
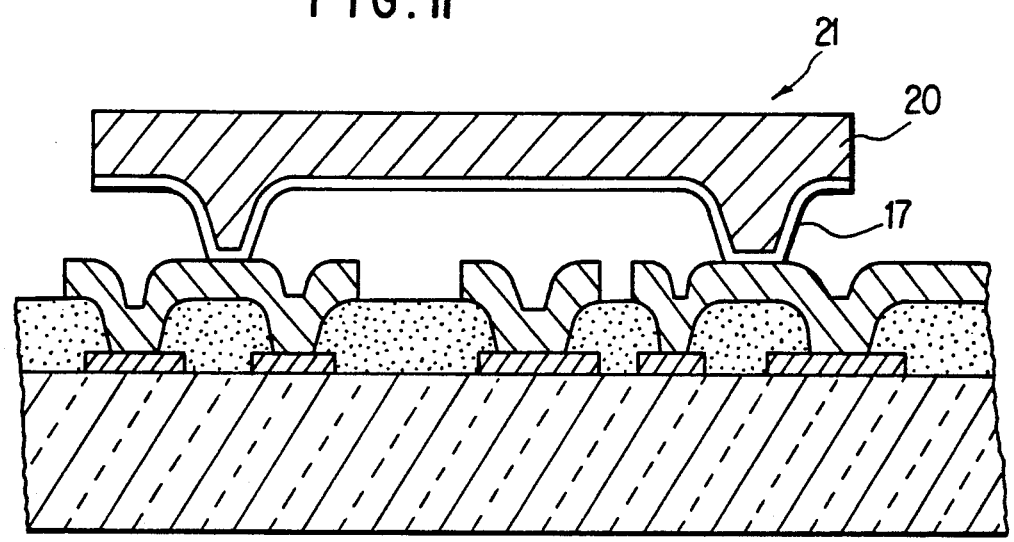

In FIG. 1C, a photo-resist 18 is formed on the entire surface of the substrate 11. An opening 19 is made in the photo-resist 18. Thereafter, an electrolytic plating is performed using a commercially available Au plating solution. In this case, the lower layer (the first layer) 17 made of W serves as a plating electrode. Specifically, the upper layer (the second layer) 20 made of Au of about 1.0 μm thick is selectively formed in the opening 19 using the photo-resist 18 as a mask. Thereafter, the photo-resist 18 is entirely removed, as shown in FIG. 1D. Further, a portion of the lower layer (the first layer) 17 made of W is etched using the upper layer (the second layer) 20 as a mask. This is performed by use of an RIE (reactive ion etching technique) using CF$_4$ (see FIG. 1E). Thereafter, the photo-resist 15 is entirely removed. As a result, a multi-layered air-bridge lead 21 having the lower layer (the first layer) 17 and the upper layer (the second layer) 20 can be obtained, as shown in FIG. 1F. The air-bridge lead 21 shown in FIG. 1F has a very high rigidity in terms of three-dimensional structure.

In the case of the conventional air-bridge lead made of Au alone, a plurality of supports must be formed at intervals of about 100 μm or less. However, the air-bridge lead 21 of this invention can be securely supported by supports formed at intervals of about 200 μm or more. This is because W has a Young's modulus of $3.62 \times 10^6$ Kg/cm$^2$ while Au has a Young's modulus of $0.812 \times 10^6$ Kg/cm$^2$. Further, the electric resistance of the air-bridge lead 21 of this invention can be held substantially the same as that of the conventional counterpart with substantially the same cross-sectional areas to each other. This is because the thickness ratio of the Au layer to the W layer in the air-bridge lead 21 of this invention is about 10:1. In other words, the surface area of the air-bridge lead 21 of this invention can be held substantially the same as that of the conventional counterpart. As a result, the electric capacitance of the air-bridge lead 21 of this invention can be held at about 30 fF ($30 \times 10^{-15}$F) in the case of the line width/space width = 3 μm/3 μm. This electric capacitance is substantially the same as that of the conventional counterpart. Therefore, the mechanical strength of the air-bridge lead structure of this invention can be significantly improved without sacrificing the advantages thereof.

Figure 2A:
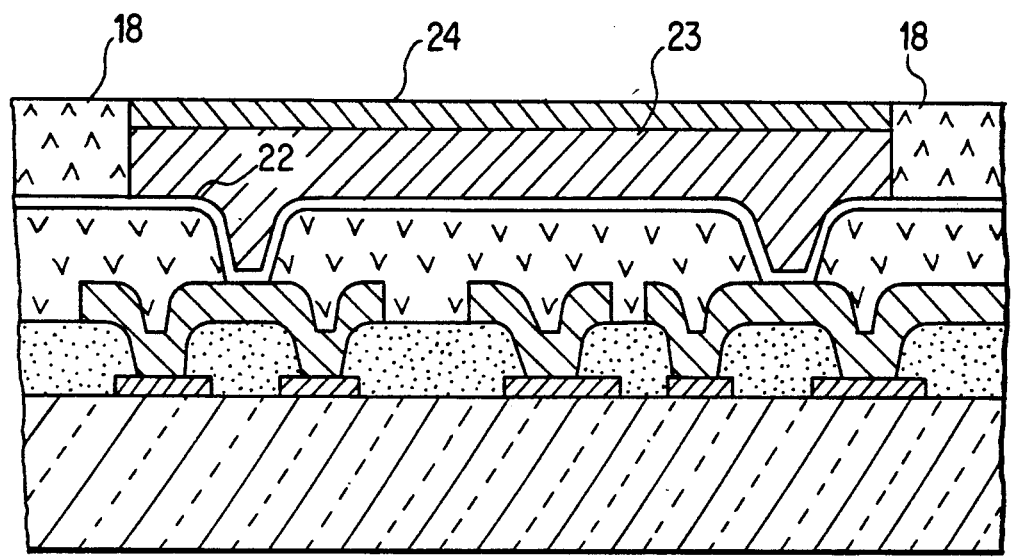
FIGS. 2A through 2C are cross-sectional views illustrating the processes of manufacturing a second embodiment according to the present invention.
Figure 2B:
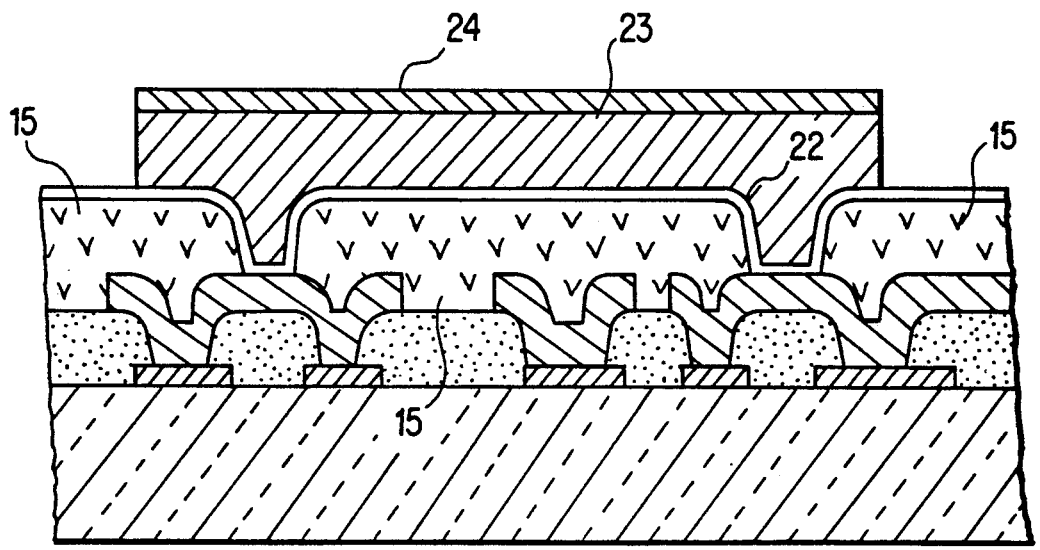
Figure 2C:
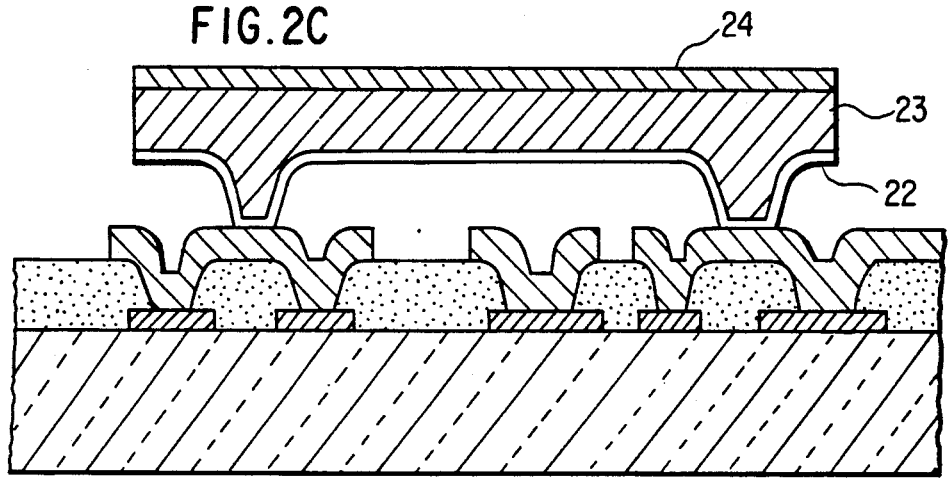
Figure 3A:
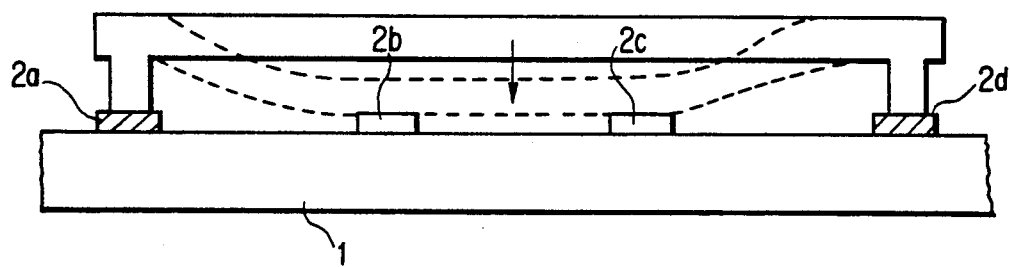
FIGS. 3A and 3B are cross-sectional views illustrating a conventional device.
Figure 3B:
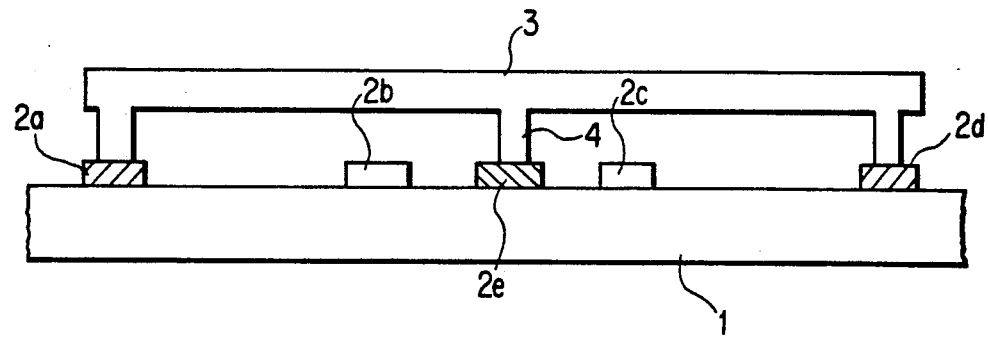

FIGS. 2A through 2C show the processes of manufacturing a second embodiment according to the present invention. In this embodiment, three metal layers constitute an air-bridge lead. The description of the processes which are the same as those in the first embodiment will be omitted. In FIG. 2A, a first layer 22, which serves also as a plating electrode in the electrolytic plating, may be made of either Au or W.

The process shown in FIG. 2A corresponds to the process shown in FIG. 1C of the first embodiment. However, this embodiment differs from the first embodiment in the following manner. Specifically, after the completion of the plating of a second Au layer 23 on the first layer 22 (Au or W), the photo-resist 18 is not removed. Further, a third layer 24 of about 1000 Å thick is formed on the second Au layer 23 by plating. The third layer 24 must be made of metals such as Rh and Ru. In this embodiment, third layer 24 is made of Rh having a Young's modulus of $2.8 \times 10^6$ kg/cm² which is about 3 times that of Au. In this embodiment, only two continuous plating processes can eliminate the disadvantages of the conventional technique. After the completion of the plating of the third Rh layer 24, the photo-resist 18 is entirely removed as in the first embodiment, as shown in FIG. 2B. Next, the partial portions of the first layer 22 are selectively removed using the third Rh layer 34 as a mask. Thereafter, the photo-resist 15 is entirely removed. As a result, a multi-layered air-bridge lead structure of Au/Au/Rh or W/Au/Rh can be obtained, as shown in FIG. 2C. The thus obtained multi-layered air-bridge lead has the same advantages as in the first embodiment.

In the above-described embodiments, Au is employed as a metal material having a low specific electric resistance. However, other metals such as Al, Cu and the like may also be employed. Further any of the metals such as W, Rh, Ru, Mo and the like having a high Young's modulus may be employed to enhance the three-dimensional mechanical strength of the multi-layered air-bridge lead structure. In particular, the combination of Au and Ru or Rh is preferable. Further, the number of metal layers may be determined to be any number more than two, and they may be arranged in an arbitrary order. Furthermore, if the order of the layer of (Au, Cu, Al) and the layer of (W, Rh, Ru etc.) is changed, this invention can obtain similar advantages.

As described above, according to the present invention, an air-bridge lead structure having multi-layered metals can be easily obtained. The air-bridge lead structure of this invention has a sufficiently low electric resistance and a significantly high mechanical strength in the three-dimensional structure thereof.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor device having an air-bridge lead structure comprising:

a semiconductor substrate having a surface;

a plurality of electrodes formed on the surface of said semiconductor substrate; and an air-bridge lead electrically connected between said plural electrodes, said air-bridge lead having at least a first metal layer and a second metal layer, said first metal layer being integrally formed over an entire bottom length of said air-bridge lead and said second metal layer being formed on top of said first metal layer, said first metal layer having a Young's modulus higher than that of said second metal layer, and said second metal layer having a specific electric resistance lower than that of said first metal layer.

2. The semiconductor device of claim 1, wherein said second metal layer has a cross-sectional area greater than that of said first metal layer.

3. The semiconductor device of claim 2, wherein said second metal layer includes a metal-plated layer, and said first metal layer includes a metal layer formed by use of an evaporation technique.

4. The semiconductor device of claim 1,
   wherein said first metal layer includes a metal selected from W, Mo, Rh and Ru or a compound including at least one of W, Mo, Rh and Ru and a second metal layer including a metal selected from Au, Al and Cu.

5. The semiconductor device of claim 4, wherein said compounds include WAl, WSi₂, and MoSi₂.

6. A semiconductor device having an air-bridge lead structure comprising:

a semiconductor substrate having a surface;

a plurality of electrodes formed on the surface of said semiconductor substrate;

a first air-bridge lead layer connected between said plurality of electrodes;

a second air-bridge lead layer formed on said first air-bridge lead layer; and said first air-bridge lead layer having a Young's modulus higher than that of said second air-bridge lead layer, and said second air-bridge lead layer having a specific electric resistance lower than that of said first air-bridge lead layer, said first metal layer being integrally formed over an entire bottom length of said air-bridge lead and said second metal layer being formed on top of said first metal layer.

7. The semiconductor device of claim 6, wherein said second air-bridge lead layer has a cross-sectional area greater than that of said first air-bridge lead layer.

8. The semiconductor device of claim 6, wherein said first air-bridge lead layer includes a metal selected from W, Mo, Rh and Ru, or includes a compound including at least one of W, Mo, Rh and Ru, and said second air-bridge lead layer includes a metal selected from Au, Al and Cu.

9. The semiconductor device of claim 8, wherein said first air-bridge lead layer includes W, and said second air-bridge lead layer includes Au.

10. The semiconductor device of claim 8, wherein said compounds include WAl, WSiO₂, and MoSiO₂.

* * * * *